United States Patent [19]

Ammann

[11] Patent Number: 5,014,413

[45] Date of Patent: May 14, 1991

[54] METHOD AND APPARATUS FOR FACILITATING LOADING OF A PANEL PROCESSING MACHINE AND POSITIONING OF ARTWORK ON A WORK SURFACE THEREON

[75] Inventor: Hans H. Ammann, Chester, N.J.

[73] Assignee: AT&T Bell Laboratories, Murray Hill, N.J.

[21] Appl. No.: 351,897

[22] Filed: May 15, 1989

[51] Int. Cl.$^5$ .............................................. B23Q 7/00
[52] U.S. Cl. ...................................... 29/559; 269/303
[58] Field of Search ................. 29/559; 269/303, 304, 269/309, 310, 317, 289 R, 254 R, 900; 248/451, 316.1, 629; 211/26, 41; 355/72, 74, 75, 76; 414/749, 754

[56] References Cited

U.S. PATENT DOCUMENTS

| | | | |
|---|---|---|---|
| 2,969,766 | 1/1961 | Distel et al. | 269/254 R X |
| 4,444,494 | 4/1984 | Koyama et al. | 355/75 |
| 4,452,530 | 6/1984 | Koyama et al. | 355/75 |
| 4,793,052 | 12/1988 | Ammann et al. | 29/559 |

FOREIGN PATENT DOCUMENTS 1129821 5/1962 Fed. Rep. of Germany ........ 355/72

*Primary Examiner*—Joseph M. Gorski
*Assistant Examiner*—S. Thomas Hughes
*Attorney, Agent, or Firm*—A. G. Steinmetz

[57] ABSTRACT

A method and apparatus for positioning a locating mechanism and the artwork frame of a panel processing machine has been devised utilizing a flexible beam apparatus for suspending the panel location mechanism and artwork frame which permit these devices to be moved out of the way during loading and unloading panels into and from the work surface of processing machinery. The flexible beam suspending the location mechanism in the disclosed embodiment comprises two parallel surface thin members of resilient sheet material. These members are each attached along one edge to a rigid portion of the machinery and along an opposing edge to the panel locating mechanism. This flexible beam arrangement permits the locating elements of the locating mechanism to be moved from and restored to a previous position with great accuracy. A pair of co-planar high aspect ratio sheet beam members are used to support the artwork frame. One end of these flexible beams is each attached to the machine and an opposing end is attached to the artwork frame. These flexible beam arrangements permit the locating elements and artwork to be moved while panels are inserted into or removed from a work surface of the processing machine and restored to a previous operative position with great accuracy.

3 Claims, 4 Drawing Sheets

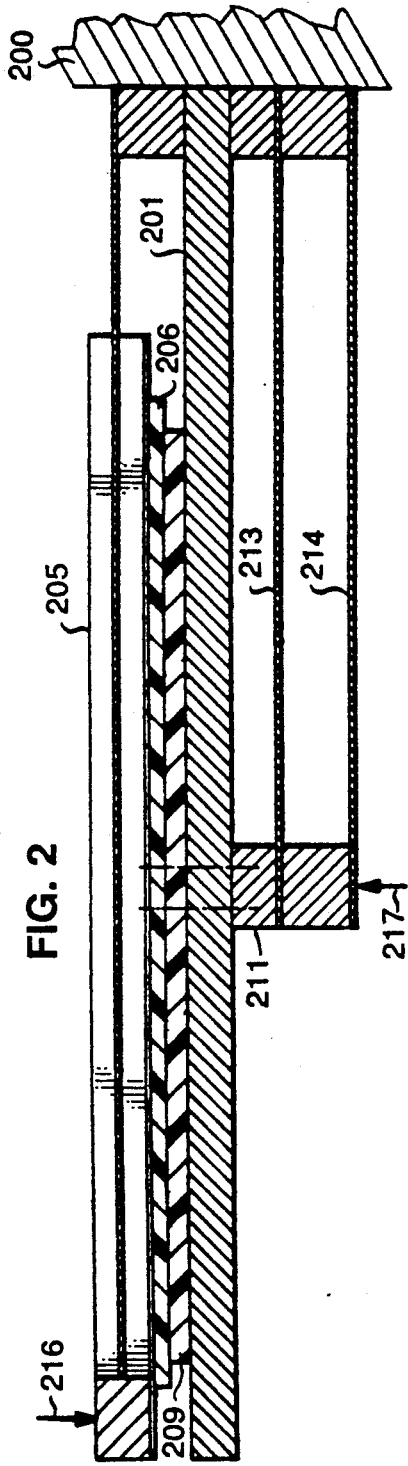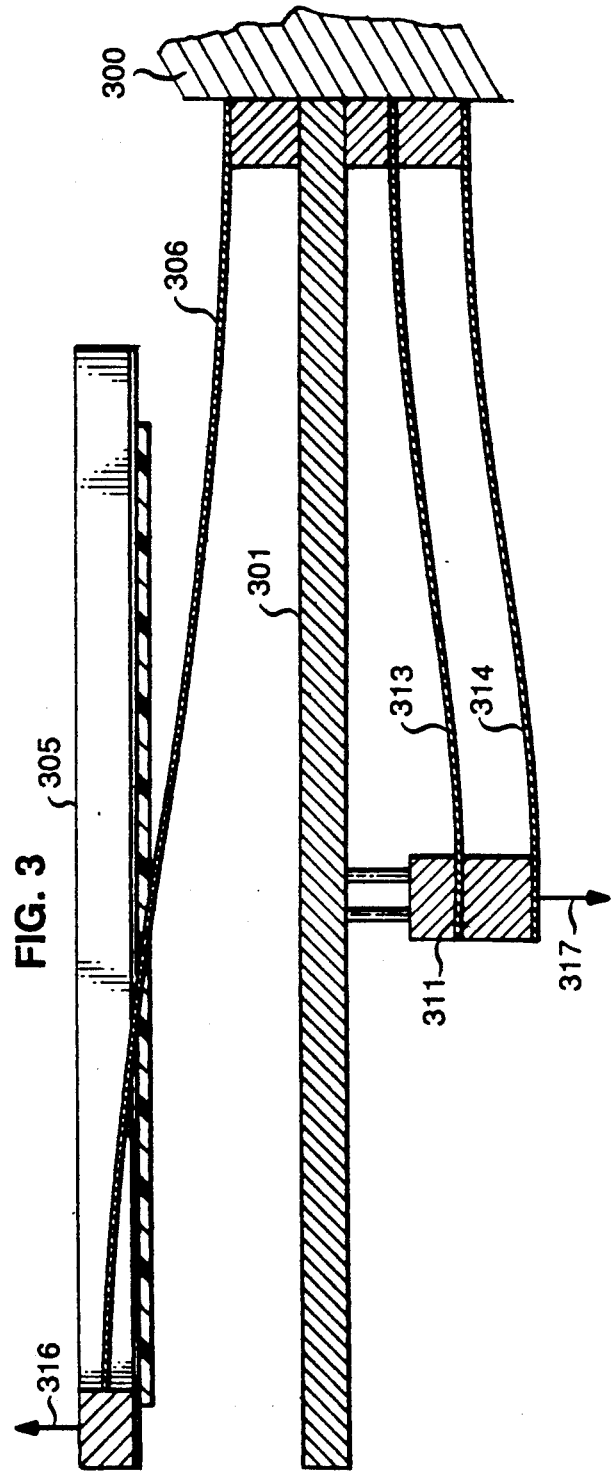

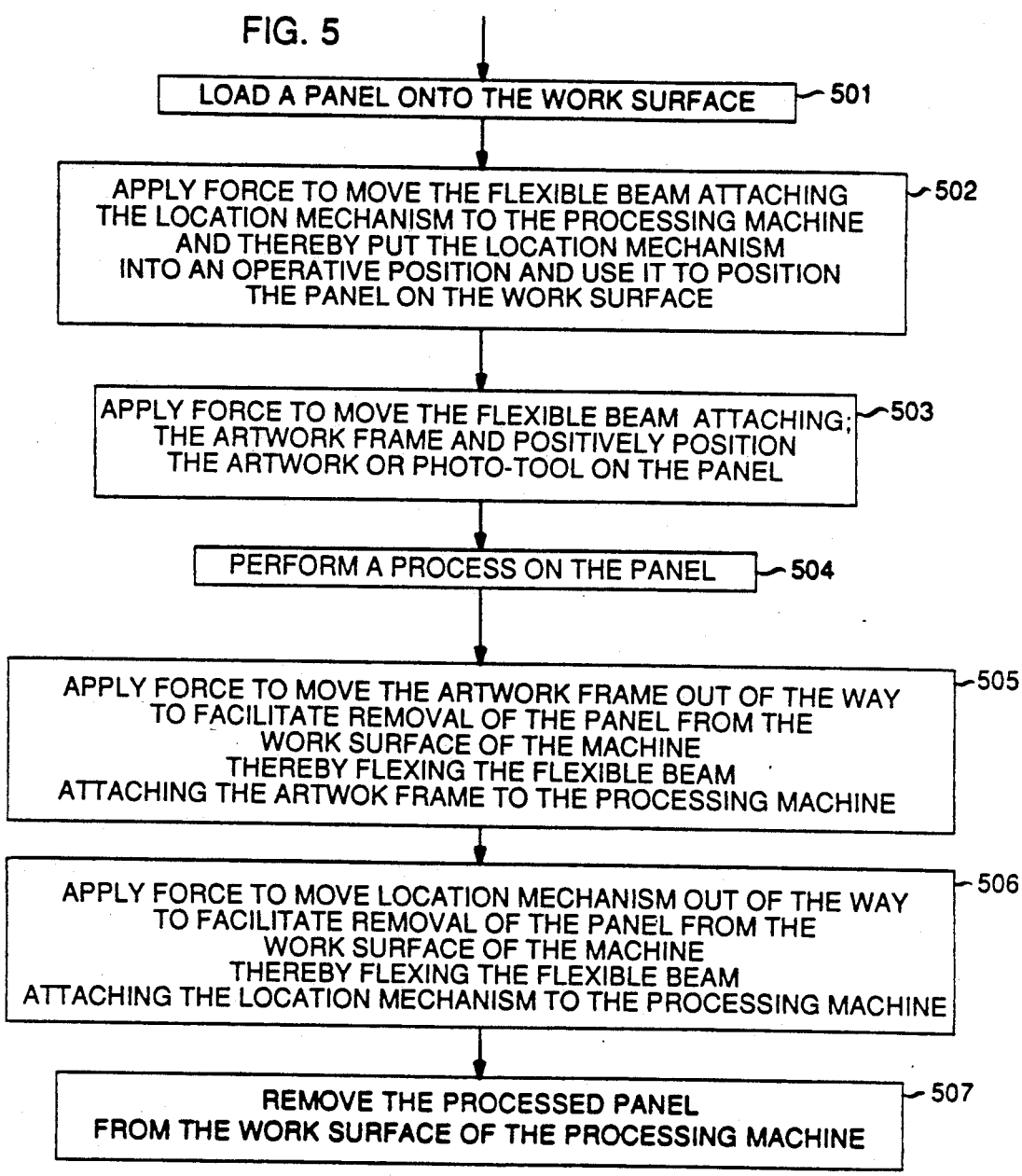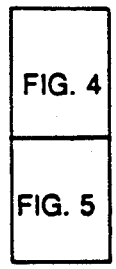

METHOD AND APPARATUS FOR FACILITATING LOADING OF A PANEL PROCESSING MACHINE AND POSITIONING OF ARTWORK ON A WORK SURFACE THEREON

FIELD OF THE INVENTION

This invention relates to a method of and related apparatus for fascilitating the loading of a panel processing machine by controllably displacing panel location mechanisms and artwork and photo tool support frames out of the way to enable loading and unloading access to a work surface of the panel processing machine and subsequently accurately restoring these elements to their original operative position.

BACKGROUND OF THE INVENTION

In machinery used for processing circuit panels provision must be made for inserting panels into and removing panels from the processing machinery. This means that photo tools and artwork frames and panel location mechanisms must be moved out of the way during loading and unloading of a work surface. Normally this has required complex linkage mechanisms and or roller bearing apparatus both of which are very expensive or do not provide consistent reliable positioning of these mechanisms over time due to the effects of wear on this apparatus.

An illustrative apparatus in the prior art for supporting and positioning artwork is disclosed in U.S. Pat. No. 4,452,530. A flexible artwork holding member operates as a support/cover for the artwork but a rigid hinged frame work is combined with the flexible artwork holding member to control positioning of the artwork. The support/cover is attached to the hinged frame work by two sliding mechanisms at opposite ends of one edge of the support/cover.

SUMMARY OF THE INVENTION

A new method and apparatus for positioning a panel location mechanism and an artwork and photo tool support frame has been devised utilizing an innovative flexible beam apparatus for suspending the panel location mechanisms and support frames in a way which permits these devices to be moved out of the way during loading and an unloading panels into and from the work surface of the panel processing machinery. The flexible beam suspending the location mechanism for the panel location mechanism in the disclosed embodiment comprises two surface parallel thin members of resilient sheet material. These parallel members are each attached along one edge to a rigid portion of the panel processing machinery and at an opposing edge to the panel location mechanism. This flexible beam arrangement permits the locating elements of the panel location mechanism located below the work surface to be moved from and restored to a previous position in a substantially straight line motion with great accuracy.

A flexible beam arrangement comprising two co-planar high aspect ratio resilient sheet material members has been found satisfactory to support the artwork and photo tool support frame. One end of each co-planar member is attached to the process machine and an opposing end is attached to the artwork frame. This flexible beam apparatus permits the locating elements and artwork and photo tool support frames to be moved sufficiently out of the way to permit panels to be inserted into or removed from the panel processing machine and be subsequently restored to a previous operative position with great accuracy.

BRIEF DESCRIPTION OF THE DRAWING

FIG. 2 is an elevation view of a work surface and the artwork frame and the locating mechanism in a working operative position as viewed from the side;

FIG. 3 is an elevation view of a work surface and the artwork frame and locating mechanism in a position allowing panel loading and unloading as viewed from the side;

FIGS. 4 and 5 disclose a flow diagram specifying the steps included in a method of positioning a panel and associated artwork or photo tools in a processing machine according to the invention; and FIG. 6 shows how to join FIGS. 4 and 5.

DETAILED DESCRIPTION

Figure 1:
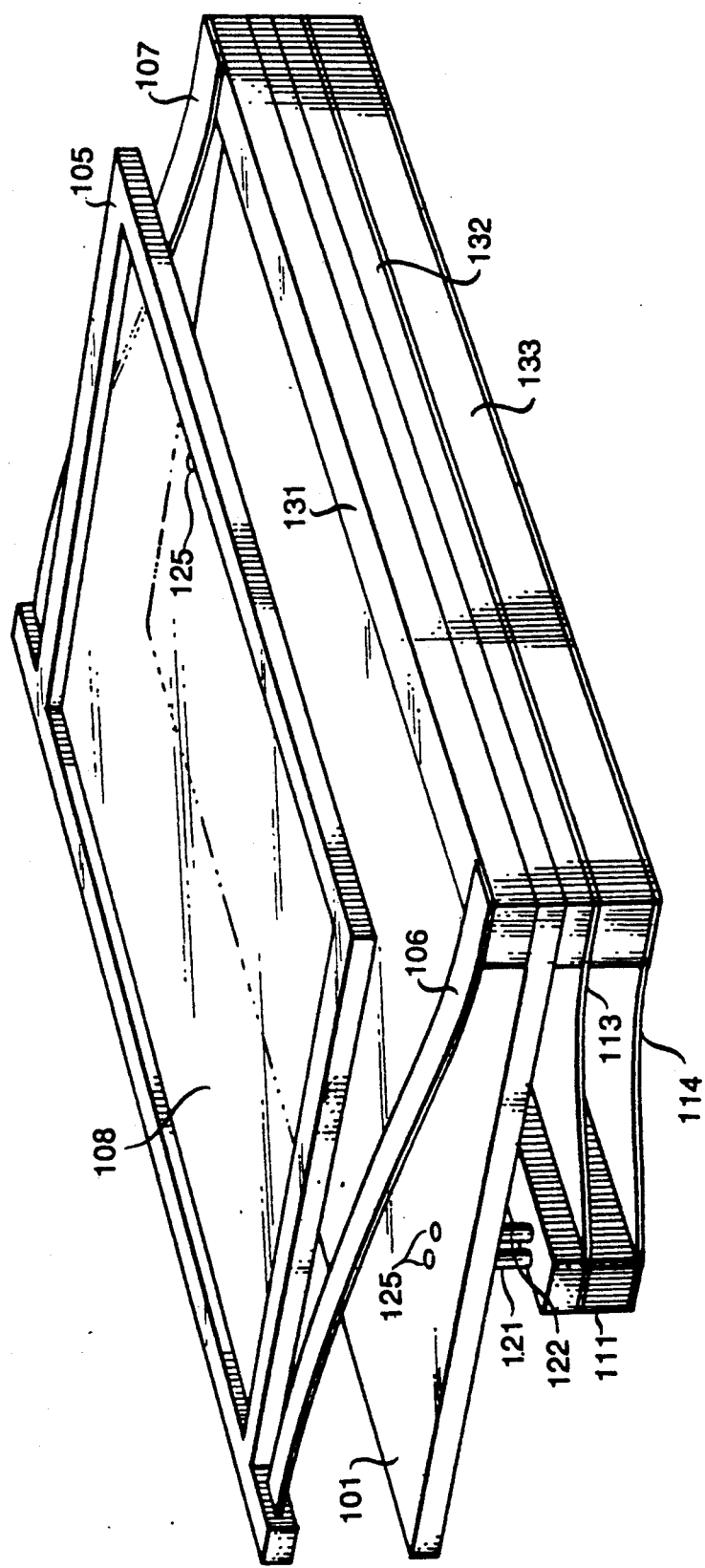
FIG. 1 is a perspective view of a work surface and an artwork or photo tool frame and a locating mechanism in a working operative position permitting loading and unloading of a working surface of a processing machine.

A perspective view of a work surface and an artwork or photo tool support frame and a locating mechanism as viewed from the rear and above is shown in FIG. 1. The work surface 101 on which a panel is loaded for processing is part of a panel processing and support machine. The support structure comprising structural support beams 131, 132 and 133, along with the work surface 101, are attached to a rigid processing machine structure (not shown in FIG. 1). A frame 105, to which photo tools or artwork (shown as a clear translucent sheet 108) may be attached, is in turn coupled by two co-planar flexible high aspect ratio members of resilient sheet material 106 and 107 to the beam 131 and from thence to the processing machine structure. The rigidity of the locating structure limits motion of the artwork frame 105 to that motion permitted by the sinuous flexing of the two coplanar flexible beams 106 and 107 and its rest or operable position is precisely repeatable and operable for precisely positioning the artwork or photo tool very accurately for accurate processing of the panel to be positioned on the work surface 101.

Located under the work surface is a panel location mechanism 111 which is used to position and secure the panel to be processed on the work surface 101. A pair of resilient sheet members 113 and 114, which are surface planarly parallel to each other, or have all similar coordinate planar points of the two members 113 and 114 substantially equidistant from each other, interconnect the panel location mechanism 111 to support beams 132 and 133 and from thence to the processing machine. Members 113 and 114 may be constructed of a resilient sheet metal.

The panel location mechanism 111 per se has been previously disclosed in U.S. Pat. No. 4,793,052 and this disclosure is incorporated herein for its disclosure of operating principles and apparatus details of that mechanism. Briefly, this panel location mechanism 111 includes paired engaging elements (121–122 as shown at one end) which are positioned to engage paired apertures created at opposite ends of the panel or artwork. The paired engaging elements are inserted through holes 125 in the work surface into the paired apertures created in the panel and are moved equidistantly is opposing directions making contact with the paired apertures of the panel. This contact accurately positions and secures the panel to the work panel surface 101. A comprehensive explanation of this locating process is provided in the referenced patent.

A side view in FIG. 2 of the apparatus of FIG. 1 shows the work surface 201 in a loaded condition with a panel 209 to be processed accurately located and secured in place and with both flexed beam arrangements supporting the panel location mechanism and artwork frame, respectively, in an operative and panel supporting mode. The work surface 201 and location and support mechanisms are attached to the processing machine structure 200 (as shown schematically). The artwork frame 205 rests on the work surface 201 with the artwork 208 adjacent the loaded panel 209. A force 216 which may be supplied by gravity or by a mechanical apparatus (not shown in FIG. 2) holds the artwork frame 205 in place. The artwork or photo-tool 208 is clamped or firmly secured to the artwork frame 205. While this clamping mechanism is not shown per se, its implementation will be readily apparant to those skilled in the art.

A force 217 supplied by a mechanical apparatus (not shown in FIG. 2) holds the panel location mechanism 211 in place. The flexible sheet metal members 213 and 214 of the flexible beam arrangement are in an operative condition to facilitate panel processing. The panel 209 is secured to the work surface 201 by the engaging elements of the panel location mechanism 211 and cannot be removed while the artwork frame 205 and location mechanism 211 are in their operative positions.

Loading and unloading of panels to and from the work surface is interfered with by the artwork frame 205 and the panel location mechanism 211 in their operative position. These securing and location devices must be moved out of the way to permit loading and unloading, but must be accurately repositioned into place to maintain the required precision of operations performed on the panels.

A lifting force 316 is applied to the artwork frame 305 to lift away from the work surface 301, as shown in FIG. 3. Integrity of position of the artwork frame 305 is maintained by the two co-planar high aspect ratio flexible members 306 and 307 (307 not shown) which act as a flexible beam securing the artwork frame to the machine 300 and which permit the artwork frame 305 to be moved out of the way for loading and unloading and to repositioned with great accuracy for enabling processing of the panel.

A removal force 317 is applied to the panel location mechanism 311 to move it out of its operating position to facilitate panel loading and unloading. The panel location mechanism 311 is secured to the support machine 300 by a flexible beam comprising the two resilent sheet material members 313 and 314 which are substantially planarly surface parallel to or have their corresponding points equidistant from each other. This beam arrangement substantially constricts motion of the location mechanism 311 to a vertical straight line motion and permits it to be accurately and repeatedly repositioned to permit the location mechanism to accurately locate and secure panels to the work surface 301.

Figure 4:
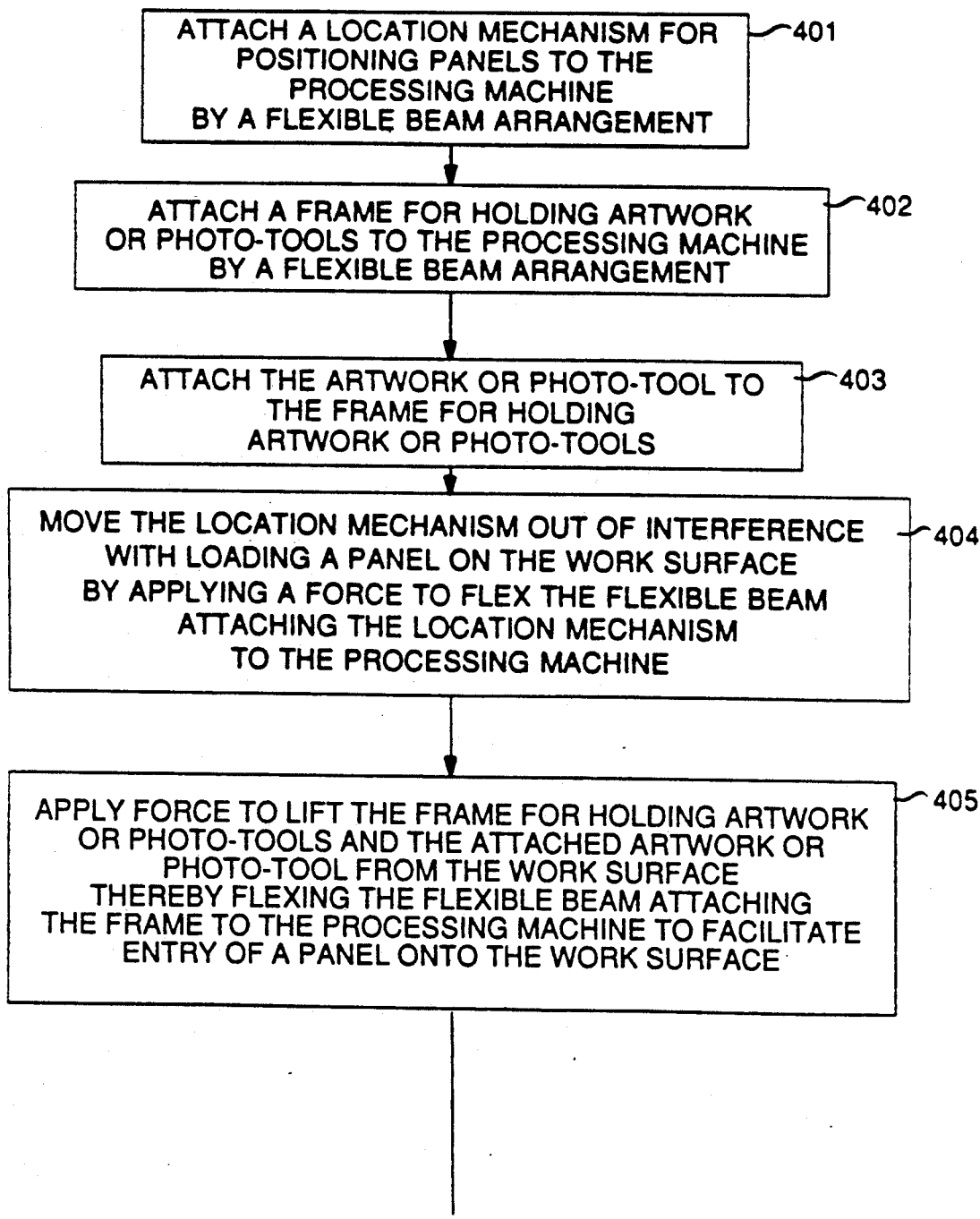

A preferred method of operation of loading and unloading panels from the work surface of the proccessing machine is detailed in the flow chart in FIGS. 4 and 5. It initially requires a set up of the panel and artwork locating mechanism as shown by the flow process steps 401 and 402 in FIGS. 4 and 5, before panel processing is initiated, so that it may be utilized for positioning the panels on the work surface. Simultaneously the artwork frame is in an open position (402) as shown in FIG. 3 permitting the artwork or photo-tool to be attached to the frame (403).

The artwork or photo-tool is secured to the artwork frame (403) and the location mechanism is relaxed permitting the artwork frame including the now attached artwork or photo-tool and the location mechanism to be moved by application of some applied defecting force into the release position or in the loading position, as shown in FIG. 3. That will permit the panel, which is to be processed, to be loaded onto the work surface without obstruction (404, 405).

With the artwork frame and location mechanism positioned out of the way the panel is loaded onto the work surface (501). The location mechanism is then brought into position to have its locating elements engage prepared apertures in the panel (502). The location mechanism is activated in step 502 so that it positions the panel by having its locating elements move synchronously and equidistantly in opposing directions accurately positioning the panel on the work surface thereby.

The artwork frame is then brought into its operative position in step 503 so that the artwork or photo-tool is accurately positioned on top of the panel to be processed. Work is performed on the panel by the processing machine in step 504.

Removal of the finished panel is facilitated by first releasing the locating elements of the location mechanism so that they no longer secure the panel to the work surface by the applied pressure of the locating elements. The location mechanism and the artwork frame are moved out of the way in steps 505 and 506 as shown in FIG. 3 and the panel is removed from the work surface in step 507.

While a specific embodiment of the arrangement has been shown enabling a method of processing panels in a panel processing machine many other arrangements will suggest themselves to those skilled in the art without departing from the spirit and scope of the invention.

What is claimed is:

1. A method of providing insertion and withdrawl of a panel onto and off of a work surface of a machine for processing the panel;

comprising the steps of:

attaching a panel locating mechanism to one end of a first flexible beam mechanism and connecting an opposite end of the first flexible beam mechanism to a structural member of the processing machine;

attaching a frame with included artwork to one of a second flexible beam mechanism and connecting an opposite end of the second flexible beam mechanism to the structural member of the processing machine;

moving the panel locating mechanism away from the work surface by application of a first force thereto, thereby flexing the first flexible beam mechanism and positioning the panel locking mechanism to prevent interference by the panel locating mechanism to loading a panel onto the work surface;

moving the frame and attached artwork away from the work surface by applying a second force thereto, thereby flexing the second flexible beam and positioning the frame and artwork to prevent interference by the frame and attached artwork to loading a panel onto the work surface;

loading a panel onto the work surface;

moving the panel locating mechanism by discontinuing application of the first force and applying an opposing force opposite the first force thereto, thereby relaxing the first flexible beam and positioning the panel locating mechanism to enable it to engage the panel and position it on the work surface, with the first flexible beam controlling a registration position of the panel locating mechanism;

moving the frame and attached artwork by discontinuing application of the second force and applying an opposing force opposite the first force thereto, thereby relaxing the second flexible beam and positioning the frame and attached artwork precisely on top of the panel, with the second flexible beam controlling a registration position of the frame and attached artwork;

performing processes on the panel;

moving the panel locating mechanism away from the work surface by application of a third force thereto, thereby flexing the first flexible beam mechanism and positioning the panel locating mechanism and its engaging elements to prevent interference by the panel locating mechanism with removing panels from the work surface;

moving the frame and attached artwork away from the work surface by applying a fourth force thereto, thereby flexing the second flexible beam and positioning the frame and attached artwork to prevent interference by the frame and attached artwork with removing panels from the work surface;

removing the panel from the work surface.

2. A method of providing insertion and withdrawl of a panel as claimed in claim 12, wherein the step of:
moving the panel locating mechanism is limited to straight line motion by the first flexible beam.

3. A method of processing a panel on a work surface of a panel processing machine;
comprising the steps of:
attaching a panel locating and securing mechanism to one end of a first flexible beam arrangement and connecting an end of the first flexible beam arrangement opposite the one end to the processing machine, wherein the first flexible beam arrangement includes at least a first flexible resilient member;

attaching a frame including artwork to one end of a second flexible beam arrangement and connecting an end of the second flexible beam arrangement opposite its one end to the processing machine;

moving the panel locating and securing by application of a first force to a position to facilitate loading a panel onto the processing machine;

moving the frame including artwork by application of a second force to a position to facilitate loading a panel onto the processing machine;

loading a panel onto the processing machine;

moving the panel locating and securing apparatus to an operating position to secure and locate the panel by applying a third force opposite the first force;

moving the frame including artwork to an operating position to perform processes on the panel by applying a forth force opposite the first force;

performing processes on the panel.

* * * * *